United States Patent
Wu

(10) Patent No.: US 7,029,997 B2
(45) Date of Patent: Apr. 18, 2006

(54) METHOD OF DOPING SIDEWALL OF ISOLATION TRENCH

(75) Inventor: Chao-Chueh Wu, Hsinchu County (TW)

(73) Assignee: ProMOS Technologies Inc., Hsinchu (TW)

( * ) Notice: Subject to any disclaimer, the term of this patent is extended or adjusted under 35 U.S.C. 154(b) by 11 days.

(21) Appl. No.: 10/707,359

(22) Filed: Dec. 8, 2003

(65) Prior Publication Data

US 2005/0037594 A1  Feb. 17, 2005

(30) Foreign Application Priority Data

Aug. 15, 2003  (TW) .............................. 92122456 A

(51) Int. Cl.
*H01L 21/425* (2006.01)
(52) U.S. Cl. ...................... 438/514; 438/524; 257/304
(58) Field of Classification Search ................. 438/452
See application file for complete search history.

(56) References Cited

U.S. PATENT DOCUMENTS

| 6,252,277 | B1 * | 6/2001 | Chan et al. ................. 257/330 |
| 6,744,089 | B1 * | 6/2004 | Wu ............................. 257/301 |
| 6,767,813 | B1 * | 7/2004 | Lee et al. .................... 438/585 |
| 2005/0012173 | A1 * | 1/2005 | Sheu et al. ................. 257/519 |

* cited by examiner

*Primary Examiner*—Thao P. Le
(74) *Attorney, Agent, or Firm*—Jianq Chyun IP Office

(57) ABSTRACT

A method of doping sidewalls of an isolation trench is provided. A substrate having a trench thereon is provided. A blocking layer is formed within the trench such that the top surface of the blocking layer is lower than the top surface of the substrate. A sidewall doping process is performed to form a doped region in the substrate at the upper trench sidewall. The blocking layer is removed from the trench. Because the blocking layer prevent dopants from reaching the bottom half of the trench during the sidewall doping process, junction leakage at the bottom section of the trench is prevented.

33 Claims, 5 Drawing Sheets

METHOD OF DOPING SIDEWALL OF ISOLATION TRENCH

CROSS REFERENCE TO RELATED APPLICATIONS

This application claims the priority benefit of Taiwan application serial no. 92122456, filed Aug. 15, 2003.

BACKGROUND OF INVENTION

1. Field of the Invention

The present invention relates to a method of forming an isolation trench. More particularly, the present invention relates to a method of doping sidewalls of an isolation trench.

2. Description of the Related Art

The isolation region of a semiconductor device is a form of partition between neighboring field effect transistor for preventing the cross diffusion of currents. Putting up an isolation trench is an effective method of isolating devices. To form an isolation trench, a pad oxide layer and a polishing stop layer are formed over a substrate. Thereafter, an anisotropic dry etching is carried out to form a trench in the semiconductor substrate. Finally, an insulation material is deposited to fill the trench serving as a device isolation structure.

Because the device that crosses over the isolation region and the corner of the active area has a relatively large electric field near the active area corner, sub-threshold leakage current has become an increasingly important problem for device operation. With the miniaturization of transistor devices and hence the reduction of channel width, the sub-threshold leakage current will be increasingly dominant resulting in the so-called narrow channel width effect. To reduce the severity of narrow channel width effect, U.S. Pat. No. 5,960,276 disclosed a method of doping sidewalls of an isolation trench. FIG. 1 is a schematic cross-sectional view showing a conventional method of doping the sidewalls of an isolation trench. First, a pad oxide layer 101 and a polishing stop layer 102 is formed over a substrate 100. Thereafter, an anisotropic dry etching is carried out to form a trench 104 in the substrate 100. A photolithographic process is carried out to form a mask layer 109. The mask layer blocks the PMOS region but exposes the NMOS region. Finally, a sidewall doping operation 106 is carried out to from a doped region 110 in the substrate 100 along the sidewalls of the trench 104.

After the sidewall doping operation 106, the doped region 110 not only spreads over the top section of the trench sidewall but also the lower and bottom section of the trench sidewall. The doped region 110 on the sidewall of the trench may overlap with the doped source/drain region of a subsequently formed transistor and increase their junction gradient. Hence, the electric field in the junction area will increase leading to a possible increase in junction leakage.

SUMMARY OF INVENTION

Accordingly, one object of the present invention is to provide a method of doping sidewalls of an isolation trench that can reduce sub-threshold leakage.

A second object of this invention is to provide a method of doping sidewalls of an isolation trench that can prevent junction leakage.

To achieve these and other advantages and in accordance with the purpose of the invention, as embodied and broadly described herein, the invention provides a method of doping sidewalls of an isolation trench. First, a substrate with at least a trench therein is provided. A blocking layer is formed within the trench. The top surface of the blocking layer is lower than the top surface of the substrate. Thereafter, a sidewall doping process is carried out to form a doped region in the substrate in the top section of the trench sidewall. Finally, the blocking layer is removed from the isolation trench.

This invention also provides a method of doping sidewalls of an isolation trench. The method can be applied to a substrate with a plurality of trenches. The substrate comprises a first region and a second region. First, a blocking layer is formed over the substrate to fill all the trenches. Thereafter, a patterned mold having at least a protruded section and at least a recess section is provided. The protruded section corresponds with the first region of the substrate and the recess section corresponds with the second region of the substrate. The patterned mold is pressed against the blocking layer so that the thickness of the blocking layer in the first region corresponding to the protruded section is lowered. After removing the patterned mold from the blocking layer, an etching operation is performed to remove a portion of the blocking layer and expose the substrate on the upper section of the trench sidewall in the first region. A sidewall doping process is carried out to form a doped region in the substrate on the upper trench sidewall of the first region. Finally, the blocking layer is removed.

In this invention, the sidewall doping process is carried out with only the upper trench sidewall exposed. This is because all of the remaining areas including the bottom section of the trench and subsequent well area adjacent to the trench sidewall are blocked by the blocking layer. With the protection of the blocking layer, junction leakage resulting from an increased junction gradient due to an area overlap between a doped sidewall and a doped source/drain region of a subsequently formed transistor is prevented.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
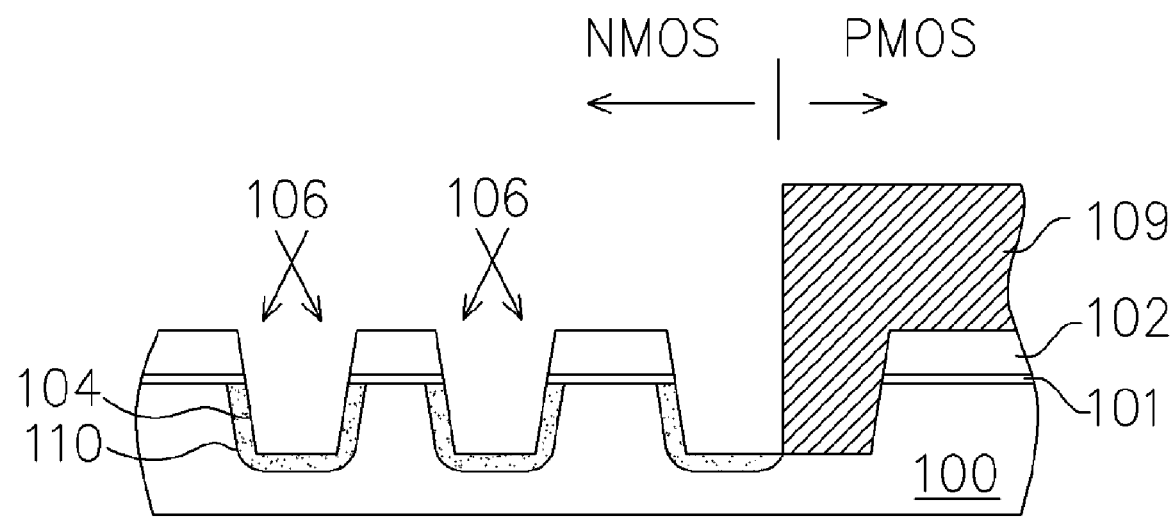
FIG. 1 is a schematic cross-sectional view showing a conventional method of doping the sidewalls of an isolation trench.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
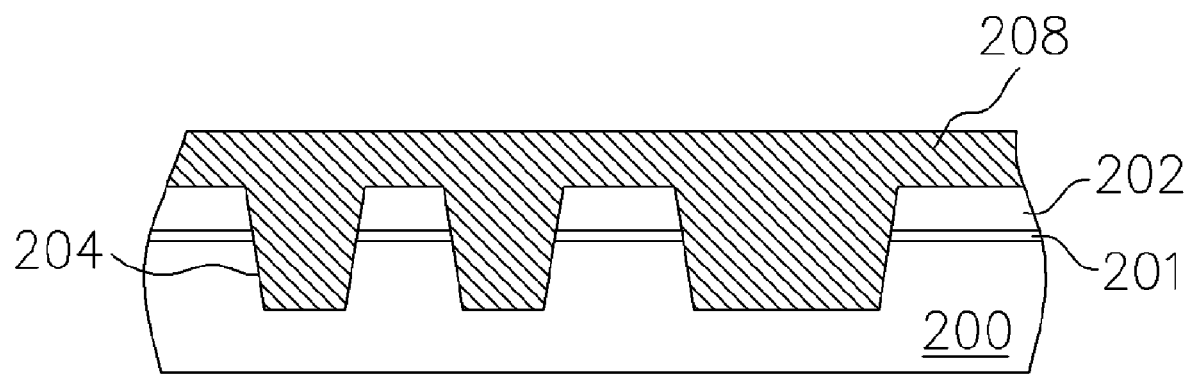
FIGS. 2A through 2D are schematic cross-sectional views showing the progression of steps of the method of doping the sidewalls of an isolation trench according to a first preferred embodiment of this invention.

FIGS. 2A through 2D are schematic cross-sectional views showing the progression of steps of the method of doping the sidewalls of an isolation trench according to a first preferred embodiment of this invention. As shown in FIG. 2A, a substrate 200 having at least a trench 204 is provided. The trench 204 is formed, for example, by forming a pad oxide layer 201 and a polishing stop layer 202 sequentially over the substrate 200 and etching the substrate 200 using the polishing stop layer 202 as a mask. Hence, the substrate 200 has a residual pad oxide layer 210 and a polishing stop layer 202. Thereafter, a blocking layer 208 is formed over the substrate 200 completely filling the trenches 204. The blocking layer 208 is formed, for example, by performing a spin-on coating or a chemical vapor deposition. Furthermore, the blocking layer 208 can be a photoresist layer, an anti-reflection coating (ARC), a spin-on dielectric layer or a doped dielectric layer. Before forming the blocking layer 208, a thermal oxide liner (not shown) may also be selectively formed over the exposed surface of the substrate 200 in the trenches 204.

Figures 1, 2B:
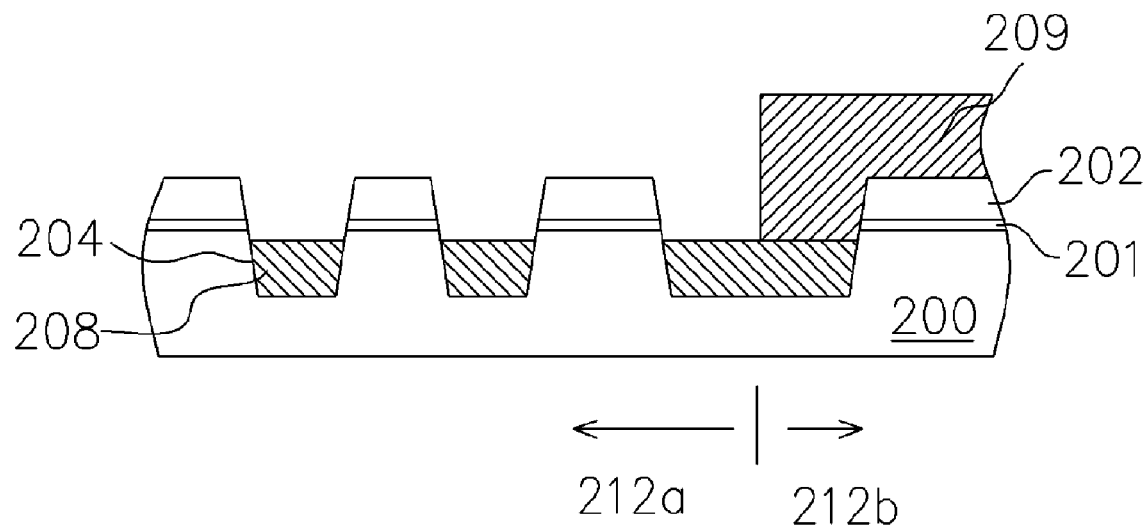

As shown in FIG. 2B-1, a portion of the blocking layer 208 is removed to expose the upper section of the trench sidewall. Hence, the top surface of the blocking layer 208 is lower than the top surface of the substrate 200. An upper section of the blocking layer 208 is removed by performing an etching operation such as a reaction ion etching process or a wet etching process. Thereafter, a photolithographic process is selectively performed to form a mask layer 209 such as a photoresist layer that covers a second region 212b but exposes a first region 212a. The first region 212a and the second region 212b are distinguished by the type of MOS transistors fabricated thereon. For example, the first region 212a is an NMOS region and the second region 212b is a PMOS region. If the blocking layer 208 is a photoresist layer, a hard baking process must be carried out to harden the blocking layer 208 first. The step height for a conventional mask layer 109 on the surface of the substrate 100 as shown in FIG. 1 includes the pad oxide layer 101, the polishing stop layer 102 and the depth of the trench 104. Compared with the convention method, the step height of the mask layer 209 is considerably lowered because the trenches 204 have already been filled by the blocking layer 208 in this invention. In other words, the process window for performing the photolithographic process is increased. In addition, if the blocking layer 208 is an anti-reflection coating (ARC), the amount of reflection during a photo-exposure operation can be reduced so that the process window for forming the mask layer 209 is further increased.

Figures 2, 2B:
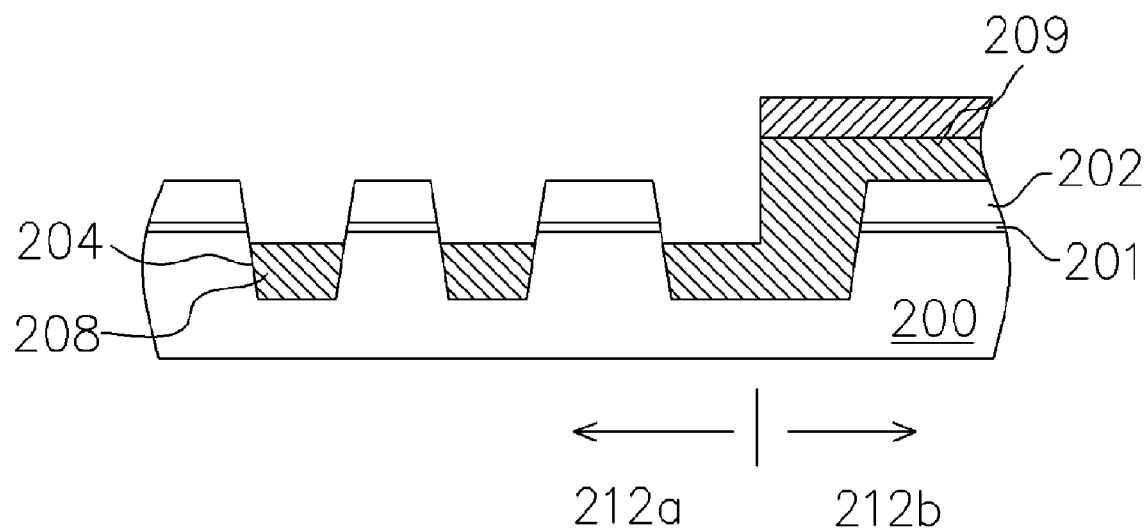

Aside from the step carried out as in FIG. 2B-1, an alternative step as shown in FIG. 2B-2 can be used. First, a patterned mask layer 209 such as a photoresist layer is formed over the blocking layer 208 within the second region 212b. Using the patterned mask layer 209 as an etching mask, a reactive ion etching or a wet etching operation is performed to remove a portion of the blocking layer 208. Ultimately, the upper sidewall of the trench 204 in the first region 212a is exposed and the top surface of the remaining blocking layer 208 is lower than the top surface of the substrate 200. The step height of the mask layer 209 is considerably lowered compared with the mask layer formed by the conventional technique because the trenches 204 have already been filled by the blocking layer 208 in this invention. In other words, the process window for performing the photolithographic process is increased. In addition, if the blocking layer 208 is an anti-reflection coating (ARC), the amount of reflection during a photo-exposure operation can be reduced so that the process window for forming the mask layer 209 is further increased.

Figures 1, 2C:
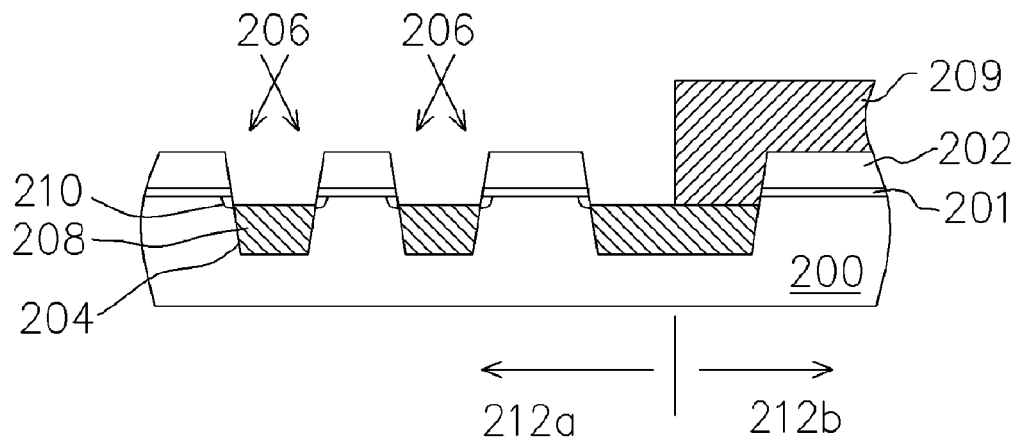
Figures 2, 2C:
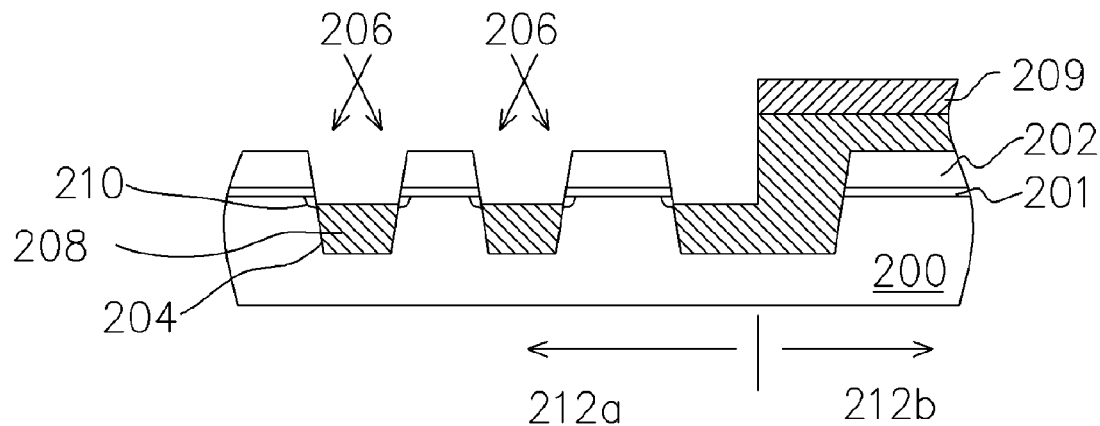

Thereafter, as shown in FIGS. 2C-1 and 2C-2, a sidewall doping process 206 such as an ion implantation (I/I) is carried out to form a doped region 210 in the substrate 200 on the upper sidewall of the trench 204. The type of ions used in the ion implantation process is complementary to the doping configuration of the source/drain terminal of a subsequently formed transistor. For example, if the subsequently formed transistor is an NMOS transistor, P-type ions (for example, boron ions) are used in the ion implantation. Furthermore, the implantation depth is shallower than the doped source/drain region of the subsequently formed transistor. The ion implantation is typically carried out using an implantation energy level between 5 to 40 KeV, a dosage between 5E12 to 1E14 ions/cm$^2$ and a slant angle relative to the perpendicular direction between 5 to 30°.

Figure 2D:
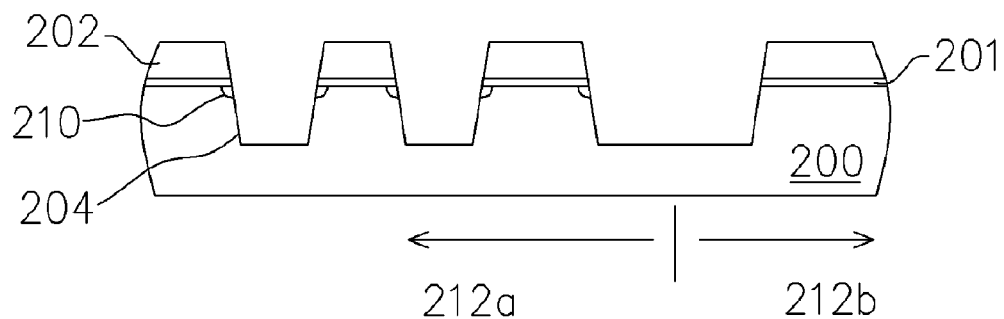

Finally, as shown in FIG. 2D, the blocking layer 208 and the mask layer 209 (refer to FIGS. 2C-1 and 2C2) within the trench 204 are removed in preparation for subsequent semiconductor fabrication processes.

Figure 3A:
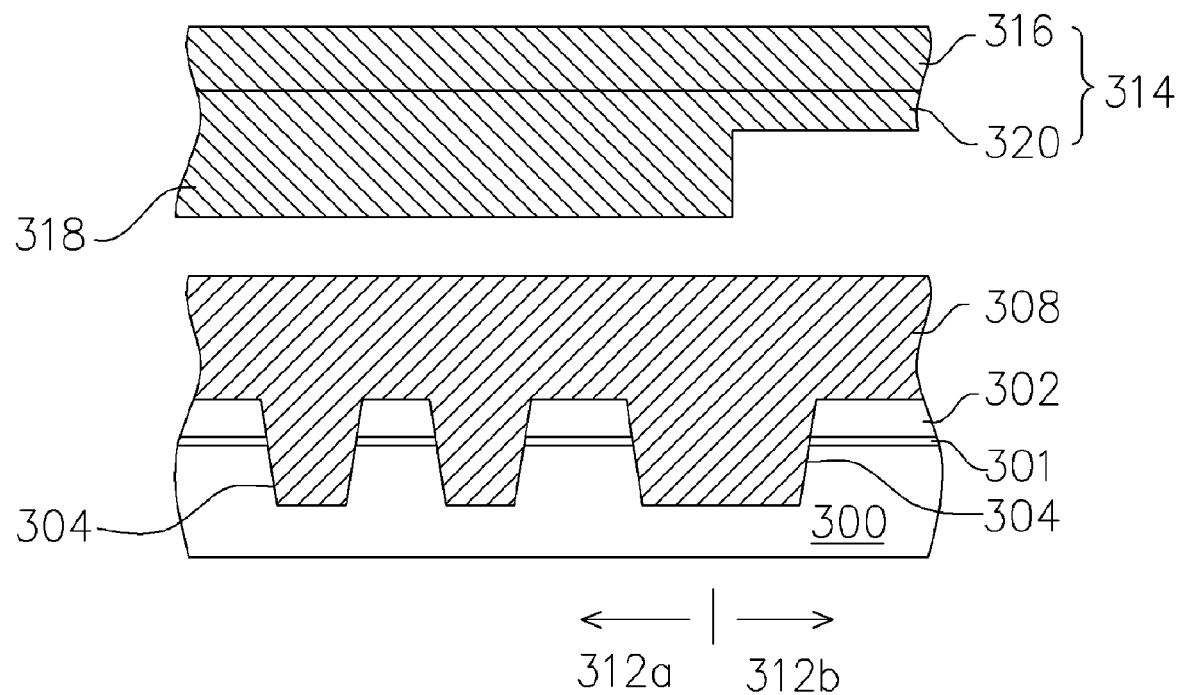
FIGS. 3A through 3D are schematic cross-sectional views showing the progression of steps of the method of doping the sidewalls of an isolation trench according to a second preferred embodiment of this invention.

FIGS. 3A through 3D are schematic cross-sectional views showing the progression of steps for doping the sidewalls of an isolation trench according to a second preferred embodiment of this invention. In the second embodiment of this invention, a nanoimprint lithographic technique is applied, a detailed description of which is disclosed in U.S. Pat. No. 6,482,742 and is included herein by reference. First, as shown in FIG. 3A, a substrate 300 with a residual pad oxide layer 301 and a polishing stop layer 302 thereon is provided. The substrate 300 comprises a first region 312a and a second region 312b. The first region 312a of the substrate 300 also has a plurality of trenches 304. Different types of MOS transistors can be formed on the first region 312a and the second region 312b. For example, NMOS transistors can be formed on the first region 312a and PMOS transistors can be formed on the second region 312b. Thereafter, a blocking layer 308 is formed over the substrate 300 completely filling the trenches 304. The blocking layer 308 is formed, for example, by a performing a spin-on coating or a chemical vapor deposition. Furthermore, the blocking layer 308 can be a photoresist layer, an anti-reflection coating (ARC), a spin-on dielectric layer, a thermoplastic polymer, a thermal-hardening layer or a radiation-hardening layer. Before forming the blocking layer 308, a thermal oxide liner (not shown) may also be selectively formed over the exposed surface of the substrate 300 in the trenches 304.

A patterned mold 314 comprising a main body 316 with a protruded section 318 and a recess section 320 underneath the main body 316 is provided. The protruded section 318 corresponds with the first region 312a of the substrate 300 and the recess section 320 corresponds with the second region 312b of the substrate 300.

Figure 3B:
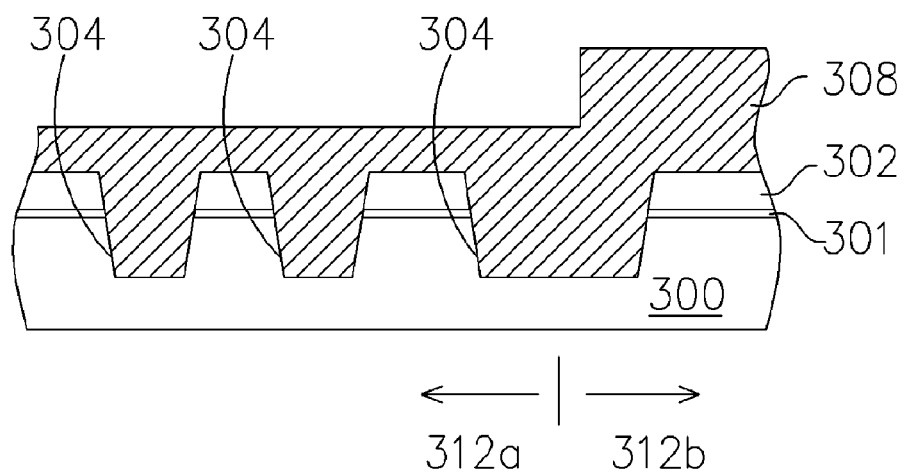

As shown in FIG. 3B, the patterned mold 314 is pressed against the blocking layer 308 so that the thickness of the blocking layer 308 in the first region 312a corresponding to the protruded section 318 is reduced and the pattern in the mold 314 is transferred to the blocking layer 308. Furthermore, the substrate 300 can be heated or irradiated to harden the blocking layer 208 when the mold 314 is still pressed against the blocking layer 308. Afterwards, the patterned mold 314 is removed from the blocking layer 308.

Figure 3C:
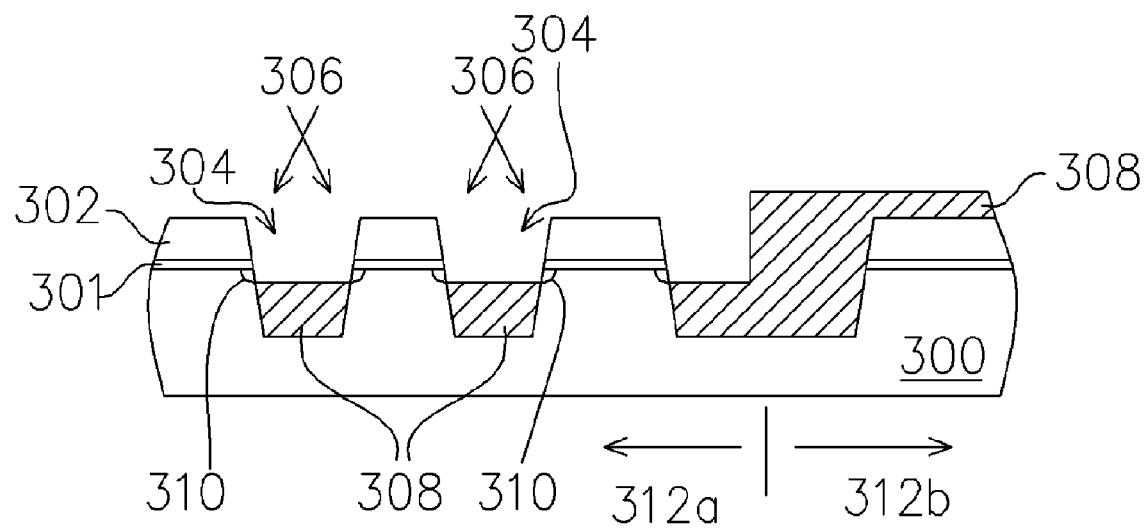

As shown in FIG. 3C, an etching operation such as a reactive ion etching or a wet etching operation is performed. After the etching operation, a portion of the blocking layer 308 is removed and the upper sidewall of the trench 304 within the first region 312a is exposed. A sidewall doping process 306 such as an ion implantation (I/I) is carried out to form a doped region 310 in the substrate 300 on the upper sidewall of the trench 304. The type of ions used in the ion implantation process is complementary to the doping configuration of the source/drain terminal of a subsequently formed transistor. For example, if the subsequently formed transistor is an NMOS transistor, P-type ions (for example, boron ions) are used in the ion implantation. Furthermore, the implantation depth is shallower than the doped source/drain region of the subsequently formed transistor. The ion implantation is typically carried out using an implantation energy level between 5 to 40 KeV, a dosage between 5E12 to 1E14 ions/cm$^2$ and a slant angle relative to the perpendicular direction between 5 to 30°.

Figure 3D:
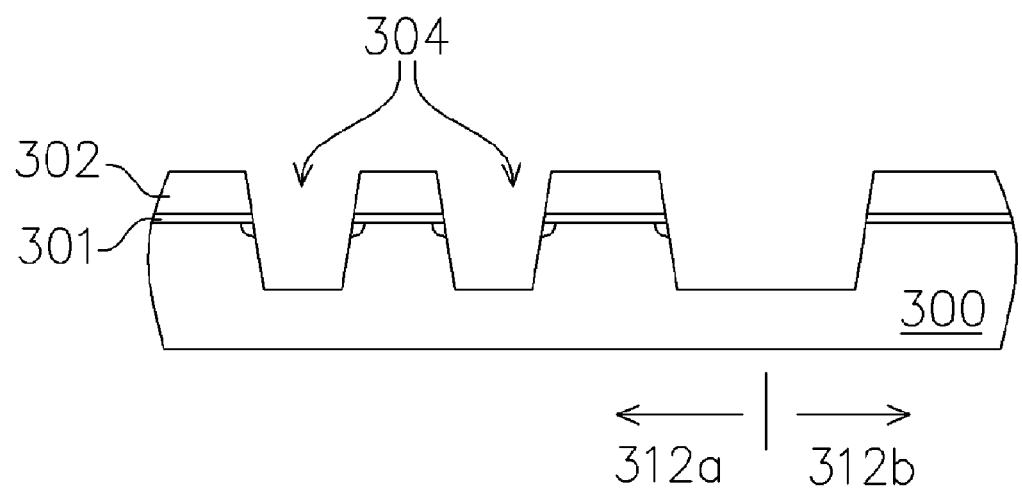

Finally, as shown in FIG. 3D, the blocking layer 308 (refer to FIG. 3C) within the trenches 304 are removed in preparation for subsequent semiconductor fabrication processes. Compared with the double layered structure (the blocking layer 208 and the mask layer 209) in the first embodiment, the second embodiment in association with the nanoimprint technique only requires a single blocking layer 308 (as shown in FIG. 3C). Thus, the number of processing steps in fabricating the isolation trench is further reduced.

In summary, one major aspect of this invention is the blocking of the bottom section and the trench sidewall neighboring other well areas during the sidewall doping process. Hence, there is no overlapping with the doped source/drain region of a subsequently formed transistor to cause junction leakage. Moreover, the increase in subthreshold leakage current due to devices crossing over the isolation region and the corner of the active area is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of doping sidewalls of an isolation trench, comprising the steps of:
    providing a substrate having a plurality of trenches thereon;
    forming a blocking layer in each trenches such that the top surface of the blocking layer is lower than the top surface of the substrate;
    performing a sidewall doping process to form a doped region in the substrate at only the upper trench sidewall; and
    removing the blocking layers within the trenches.

2. The method of claim 1, wherein the dopants in the sidewall doping process for forming the doped region are complementary to the cries for forming a doped source/drain region in the substrate adjacent to the trenches thereafter.

3. The method of claim 2, wherein the sidewall doping process comprises an ion implantation.

4. The method of claim 3, wherein the ion implantation is carried out using an energy level between 5 to 40 KeV, a dosage between 5E12 to 1E14 ions/cm$^2$ and a slant angle relative to a direction perpendicular to the substrate of between 5 to 30°.

5. The method of claim 2, wherein the depth of the doped region in the sidewall doping process is shallower than the junction depth of the subsequently formed source/drain region in the substrate adjacent to the trenches.

6. The method of claim 1, wherein the step of forming the blocking layers comprises:
    forming a blocking material layer over the substrate that completely fills the trenches and covers the top surface of the substrate; and
    performing an etching operation to remove the blocking material layer over the substrate and a portion of the blocking material layer within the trenches so that a portion of the blocking material layer remains within the trenches to form a blocking layer.

7. The method of claim 6, wherein the blocking layer is selected from a group consisting of a photoresist layer, an anti-reflecting coating, a spin-on dielectric layer, a doped dielectric layer, a thermoplastic polymer, a thermal-hardening layer and a radiation-hardening layer.

8. The method of claim 7, wherein the step for forming the blocking layer farther comprises performing a spin-on coating process or performing a chemical vapor deposition.

9. The method of claim 6, wherein the etching process further comprises performing a reaction ion etching operation or performing a wet etching operation.

10. A method of doping sidewalk of an isolation trench, comprising the steps of:
    providing a substrate divided into a first region and a second region, wherein the substrate has a plurality of trenches in the first region and the second region;
    forming a blocking material layer over the substrate that completely fills the trenches;
    forming a mask layer over the substrate to cover the second region; performing an etching operation to remove a portion of the blocking material layer so that the top surface of the blocking material layer within the trenches in the first region is lower than the top surface of the substrate;
    performing a sidewall doping process to form a doped region in the substrate at only the upper trench sidewall; and
    removing the mask layer and to blocking material layer.

11. The method of claim 10, wherein the etching process is carried out before forming the mask layer.

12. The method of claim 10, wherein the etching process is carried out after forming the mask layer.

13. The method of claim 10, wherein the etching process comprises performing a reactive ion etching process or performing a wet etching process.

14. The method of claim 10, wherein the blocking material layer is selected from a group consisting of a photoresist layer, an anti-reflecting coating, a spin-on dielectric layer and a doped dielectric layer, and the mask layer comprises a photoresist layer.

15. The method of claim 14, wherein the step for forming the blocking layer further comprises performing a spin-on coating process or performing a chemical vapor deposition.

16. The method of claim 10, wherein the dopants in the sidewall doping process for forming the doped region are complementary to the ones for forming a doped source/drain region in the first region of the substrate adjacent to the trenches thereafter.

17. The method of claim 16, wherein the sidewall doping process comprises an ion implantation.

18. The method of claim 17, wherein the ion implantation is carried out using an energy level between 5 to 40 KeV, a dosage between 5E12 to 1E14 ions/cm$^2$ and a slant angle relative to a direction perpendicular to the substrate of between 5 to 30°.

19. The method of claim 16, wherein the depth of the doped region in the sidewall doping process is shallower than the junction depth of the subsequently formed source/drain region in the first region of the substrate adjacent to the trenches.

20. The method of claim 10, wherein different types of MOS devices are formed on the first region and the second region of the substrate.

21. A method of doping sidewalls of an isolation trench, comprising the steps of:
provinding a substrate divided into a first region and a second region, wherein the first region and the second region of the substrate have a plurality of wenches thereon;
forming a blocking layer over the substrate, wherein the blocking layer in the second region completely fills the trenches and covers the substrate surface whereas the blocking layer in the first region fills the trenches but exposes the top surface of the substrate, and the top surface of the blocking layer within the first region is lower than the top surface of the substrate;
performing a sidewall doping process to form a doped region in the substrate at only the upper trench sidewall; and
removing the blocking layer.

22. The method of claim 21, wherein the step for forming the blocking layer comprises: forming a blocking material layer over the substrate that completely fills the trenches in the first region and the second region, wherein the blocking layer in the second region is ticker than the blocking layer in the first region; and
performing an etching operation to remove a portion of the blocking material layer to form the blocking layer.

23. The method of claim 22, wherein the step for forming the blocking material layer comprises:
forming a material layer over the substrate to fill the trenches in the first region and the second region such that the blacking layer in the second region and the blocking layer in the first region have almost identical thickness; and
performing a nanoimprint process by pressing a mold into the material layer so that thickness of the material layer in the first region is reduced.

24. The method of claim 23, wherein the mold has a pattern at least comprising a protruded section and a recess section such that the protruded section corresponds to the first region of the substrate and the recess section corresponds to the second region of the substrate.

25. The method of claim 23, wherein the material layer is selected from a group consisting of a photoresist layer, an anti-reflecting coating, a spin-on dielectric layer, a doped dielectric layer, a thermoplastic polymer, a thermal-hardening layer and a radiation-hardening layer.

26. The method of claim 25, wherein the step of pressing the mold against the material layer further comprises performing a hardening process.

27. The method of claim 26, wherein the hardening process further comprises performing a heating process or performing an irradiation process.

28. The method of claim 22, wherein the etching process comprises performing a reactive ion etching process or performing a wet etching process.

29. The method of claim 21, wherein the dopants in the sidewall doping process for forming the doped region are complementary to the ones for forming a doped source/drain region in the first region of the substrate adjacent to the trenches thereafter.

30. The method of claim 21, wherein the sidewall doping process comprises an ion implantation.

31. The method of claim 30, wherein the ion implantation is carried out using an energy level between 5 to 40 KeV, a dosage between 5E12 to 1E14 ions/cm$^2$ and a slant angle relative to a direction perpendicular to the substrate of between 5 to 30°.

32. The method of claim 21, wherein the depth of the doped region in the sidewall doping process is shallower than the junction depth of the subsequently formed source/drain region in the first region of the substrate adjacent to the trenches.

33. The method of claim 21, wherein different types of MOS devices are formed on the first region and the second region of the substrate.

* * * * *